United States Patent
Otsuka et al.

(10) Patent No.: US 7,609,581 B2
(45) Date of Patent: Oct. 27, 2009

(54) SEMICONDUCTOR MEMORY DEVICE (75) Inventors: Nobuaki Otsuka, Komae (JP); Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 11/772,587

(22) Filed: Jul. 2, 2007

(65) Prior Publication Data
US 2007/0280009 A1    Dec. 6, 2007

Related U.S. Application Data (62) Division of application No. 11/416,122, filed on May 3, 2006, now Pat. No. 7,362,646.

(30) Foreign Application Priority Data
Mar. 13, 2006   (JP) .............................. 2006-067988

(51) Int. Cl.
*G11C 5/14*   (2006.01)
(52) U.S. Cl. ...................... 365/226; 365/229; 365/227; 365/189.09; 365/185.24
(58) Field of Classification Search ................ 365/226, 365/227, 229, 189.09, 185.24
See application file for complete search history.

(56) References Cited

U.S. PATENT DOCUMENTS

| | | | | |
|---|---|---|---|---|
| 6,329,871 B2 * | 12/2001 | Taguchi | ...................... | 327/539 |
| 6,628,554 B2 * | 9/2003 | Hidaka | .................. | 365/189.09 |
| 6,657,911 B2 * | 12/2003 | Yamaoka et al. | ............. | 365/226 |
| 6,831,483 B2 * | 12/2004 | Shimazaki et al. | ........... | 326/121 |
| 6,885,057 B2 * | 4/2005 | Osada et al. | ................. | 257/316 |
| 7,042,245 B2 * | 5/2006 | Hidaka | ......................... | 326/34 |
| 7,362,646 B2 * | 4/2008 | Otsuka et al. | ................ | 365/226 |
| 7,382,674 B2 * | 6/2008 | Hirabayashi | ................. | 365/226 |

FOREIGN PATENT DOCUMENTS

JP    2004-206745    7/2004

OTHER PUBLICATIONS

Masanao Yamaoka, et al., "A 300MHz 25 μA/Mb Leakage On-Chip SRAM Module Featuring Process-Variation Immunity and Low-Leakage-Active Mode for Mlobile-Phone Application Processor", 2004 IEEE International Solid-State Circuits Conference, Session 27,27.2, Feb. 18, 2004, 10 pages.

* cited by examiner

*Primary Examiner*—Viet Q Nguyen
(74) *Attorney, Agent, or Firm*—Oblon, Spivak, McClelland, Maier & Neustadt, L.L.P.

(57) ABSTRACT

A semiconductor memory device includes a memory cell array provided in a cell array area and including a plurality of memory cells, a source potential line which applies a source potential to the memory cells, a switching element group provided in the cell array area adjacent to the memory cell array, the switching element group electrically connecting the source potential line to a ground potential line, when the memory cells are in an operation mode, a first P-type MIS transistor connected between the source potential line and the ground potential line, and fixing the source potential when the memory cells are in the sleep mode, and a bias generation circuit provided in a peripheral circuit area, and supplying a first bias potential to the first MIS transistor, the first MIS transistor being provided in the peripheral circuit area.

5 Claims, 8 Drawing Sheets

SEMICONDUCTOR MEMORY DEVICE

CROSS-REFERENCE TO RELATED APPLICATIONS

This application is a divisional of and claims the benefit of priority under 35 USC §120 from U.S. Ser. No. 11/416,122, filed May 3, 2006 now U.S. Pat. No. 7,362,646 and is based upon prior Japanese Patent Application No. 2006-067988, filed Mar. 13, 2006, the entire contents of both of which are incorporated herein by reference.

BACKGROUND OF THE INVENTION

1. Field of the Invention

The present invention relates to a semiconductor device, and more particularly to a static random access memory (SRAM) including static memory cells.

2. Description of the Related Art

Leakage current increases in accordance with the development of microfabrication of SRAMs. A technique has been proposed in, for example, Jpn. Pat. Appln. KOKAI Publication No. 2004-206745, in which an increase in leakage current occurring in cell arrays is counteracted by reducing a power supply bias applied to the cell arrays in a standby state in which no write/read operations are performed.

A cell-bias control circuit comprises, for example, power-supply interruption switches for interrupting the direct application of ground potential VSS to memory cells, and clamping PMOS transistors for clamping the potential level of source potential lines isolated from the power supply. The cell bias is adjusted to an optimal value using a bias potential applied to the gate electrode of the clamping PMOS transistors.

The clamping PMOS transistors and power-supply interruption switches are arranged along ends of a cell array. Since the clamping PMOS transistors are arranged along the ends of the cell array, the bias potential line is also arranged along the ends of the cell array and is therefore long. As a result, the influence of coupling noise cannot be ignored. To avoid this influence, it is necessary to shield the bias potential line. This inevitably increases the area needed for the semiconductor device, and gives limitations on the signal lines above and below the shielded line. This problem is more conspicuous when the semiconductor device includes a plurality of arrays and accordingly includes a plurality of bias potential lines.

Further, the power-supply interruption switches are realized by, for example, NMOS transistors, which therefore are provided in a P-type well or semiconductor substrate, while the clamping PMOS transistors are formed in an N-type well or semiconductor substrate. This means that both the N- and P-type wells are necessary.

As the boundary (element isolation area) between the N- and P-type wells, a gap several times greater than that between standard wires is required. Accordingly, regardless of the size of each clamping PMOS transistor, a wide well boundary is required, resulting in an increased arrangement region of the power-supply interruption switches and the clamping PMOS transistors. Therefore, a chip size increases. Further, when the arrangement region is divided into a plurality of regions, they require a greater area.

BRIEF SUMMARY OF THE INVENTION

According to a first aspect of the present invention, there is provided a semiconductor memory device comprising:

a memory cell array provided in a cell array area and including a plurality of memory cells, each memory cell being of a static type and formed of metal insulator semiconductor (MIS) transistors;

a source potential line which applies a source potential to the memory cells;

a switching element group including a plurality of switching elements and provided in the cell array area adjacent to the memory cell array, the switching element group electrically connecting the source potential line to a ground potential line, when the memory cells are in an operation mode, and electrically disconnecting the source potential line from the ground potential line, when the memory cells are in a sleep mode;

a first P-type MIS transistor connected between the source potential line and the ground potential line, and fixing the source potential when the memory cells are in the sleep mode; and a bias generation circuit provided in a peripheral circuit area outside the cell array area, and supplying a first bias potential to a gate terminal of the first MIS transistor, the first MIS transistor being provided in the peripheral circuit area.

According to a second aspect of the present invention, there is provided a semiconductor memory device comprising:

a memory cell array provided in a cell array area and including a plurality of memory cells, each memory cell being of a static type and formed of MIS transistors;

a source potential line which applies a source potential to the memory cells;

a switching element group including a plurality of switching elements and provided in the cell array area adjacent to the memory cell array, the switching element group electrically connecting the source potential line to a power supply potential line, when the memory cells are in an operation mode, and electrically disconnecting the source potential line from the ground potential line, when the memory cells are in a sleep mode;

a first N-type MIS transistor connected between the source potential line and the power supply potential line, and fixing the source potential when the memory cells are in the sleep mode; and a bias generation circuit provided in a peripheral circuit area outside the cell array area, and supplying a first bias potential to a gate terminal included in the first MIS transistor, the first MIS transistor being provided in the peripheral circuit area.

DETAILED DESCRIPTION OF THE INVENTION

Embodiments of the invention will be described with reference to the accompanying drawings. In the following description, like reference numbers denote like elements, and a duplicate explanation will be given only when necessary.

FIRST EMBODIMENT

Figure 1:
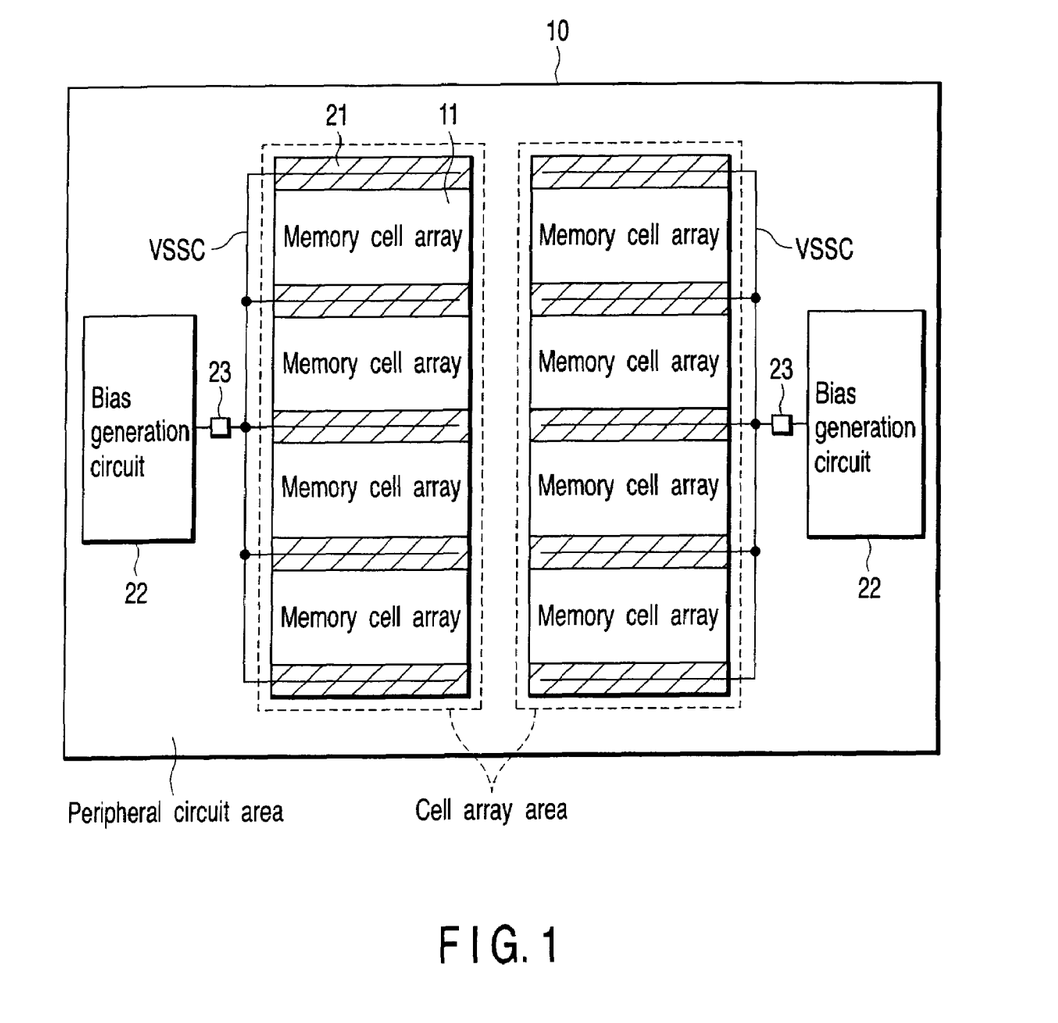
FIG. 1 is a schematic block diagram illustrating an SRAM 10 according to a first embodiment of the invention.

FIG. 1 is a schematic block diagram illustrating an SRAM 10 according to a first embodiment of the invention. The SRAM 10 comprises a cell array area and peripheral circuit area. The cell array area includes a plurality of memory cell arrays 11 formed of a plurality of static memory cells MC. The peripheral circuit area includes peripheral circuits used to write and read data to and from the memory cell arrays 11.

Figure 2:
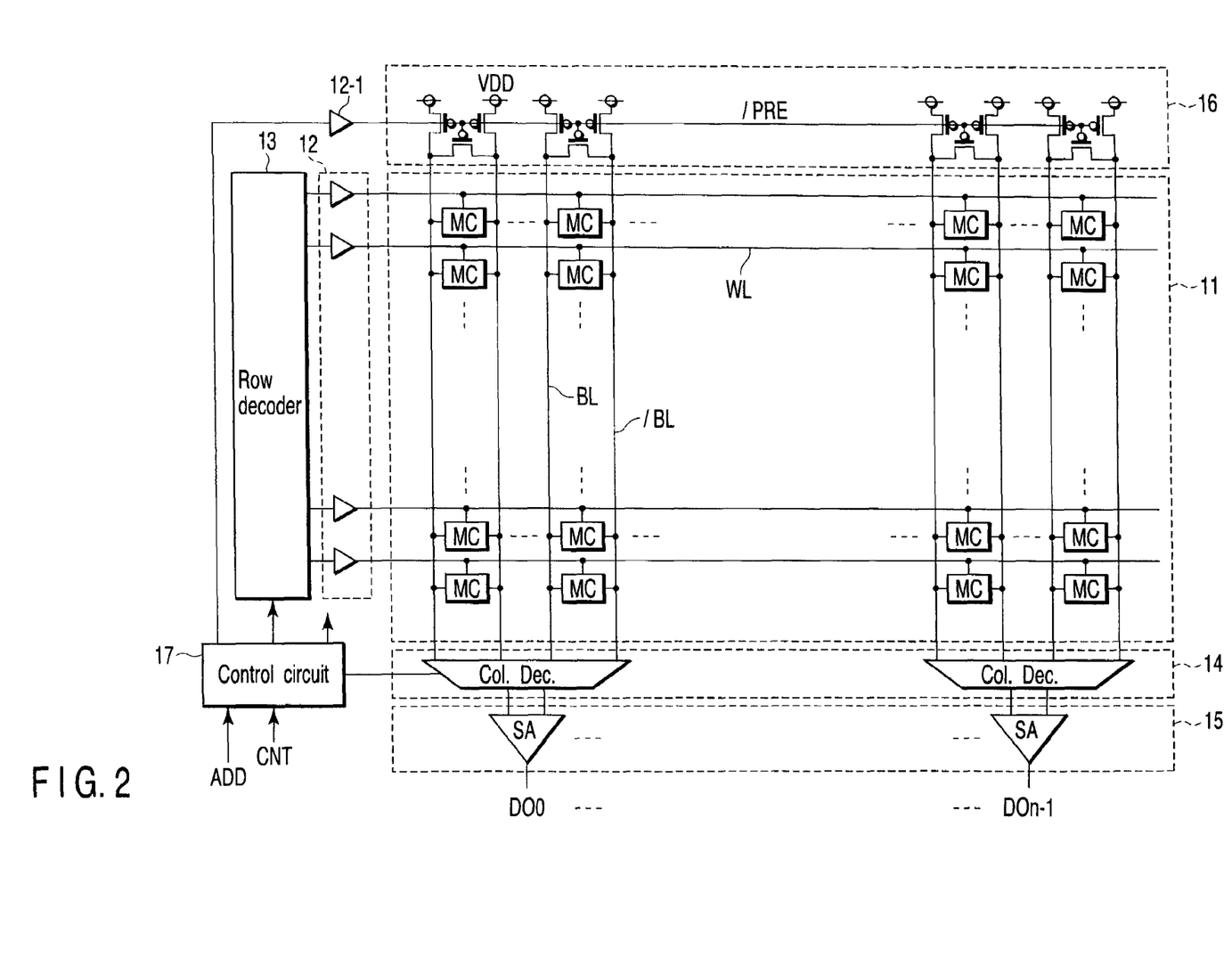
FIG. 2 is a block diagram illustrating essential parts of a memory cell array and peripheral circuits, which are incorporated in the SRAM 10.

Examples of peripheral circuits will be described. FIG. 2 shows essential parts of a memory cell array 11 and peripheral circuits incorporated in the SRAM 10.

A plurality of word lines WL extend in the row direction of the memory cell array 11. Further, pairs of bit lines BL and /BL extend in the column direction of the memory cell array 11. Row selection in the memory cell array 11 is performed using the word lines WL, and column selection in the memory cell array 11 is performed using the bit lines BL and /BL.

A row decoder 13 is connected to the word lines WL via a word-line driver circuit 12. Based on a row-address signal, the row decoder 13 selects a corresponding one of the word lines WL.

A column decoder (Col. Dec.) 14 is connected to the bit line pairs BL and /BL. Based on a column address signal, the column decoder selects a corresponding pair of the bit line pairs BL and /BL.

A sense amplifier circuit 15 is formed of a plurality of sense amplifiers SA. The sense amplifier circuit 15 detects data read from the memory cell array 11 via the column decoder 14, amplifies it and outputs the amplified data as output data items DO0 to DOn-1.

A pre-charge circuit 16 pre-charges the bit line pairs BL and /BL with, for example, power supply potential VDD before read or write operation is performed. The pre-charge circuit 16 executes the pre-charging operation based on a pre-charge signal /PRE. Specifically, the pre-charge circuit 16 pre-charges the bit line pairs BL and /BL with power supply potential VDD when the pre-charge signal /PRE is at the low level, and releases the pre-charged state when the pre-charge signal /PRE is at the high level. The pre-charge signal /PRE is sent from a control circuit 17 to the pre-charge circuit 16 via a driver 12-1.

The control circuit 17 controls each circuit in the SRAM 10. An address signal ADD, control signal CNT, etc. are input to the control circuit 17. Based on the address signal ADD, the control circuit 17 generates a row-address signal and column-address signal to be supplied to the row decoder 13 and column decoder 14, respectively. Further, based on, for example, the control signal CNT, the control circuit 17 generates, for example, the pre-charge signal /PRE to be supplied to the pre-charge circuit 16.

The word-line driver circuit 12, row decoder 13, column decoder 14, sense amplifier circuit 15, pre-charge circuit 16 and control circuit 17 are provided in the peripheral circuit area.

Figure 3:
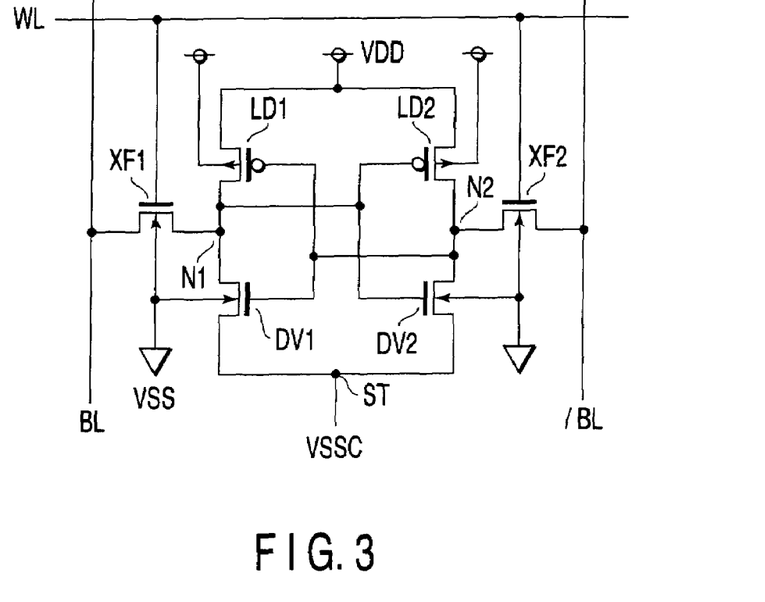
FIG. 3 is a circuit diagram illustrating a memory cell MC according to the first embodiment.

FIG. 3 is a circuit diagram illustrating a memory cell MC incorporated in the memory cell array 11 shown in FIG. 2. The memory cell MC includes first and second inverter circuits. The first inverter circuit includes, as a load, a P-channel Metal Insulator Semiconductor (MIS) transistor LD1 (in this embodiment, a Metal Oxide Semiconductor (MOS) transistor is used), and an N-channel MOS transistor DV1 as a driver. The P-channel MOS transistor (PMOS transistor) LD1 and N-channel MOS transistor (NMOS transistor) DV1 are connected in series between power supply potential VDD (i.e., the terminal set at power supply potential VDD) and source terminal ST (which is set at the source potential VSSC of the driving NMOS transistor).

The source potential VSSC is the lower one of the power supply potentials applied to the memory cell array 11, and set to a level not lower than ground potential VSS and lower than power supply potential VDD. The level of source potential VSSC is changed by a circuit controlling a cell bias.

The second inverter circuit includes a load PMOS transistor LD2 and a driving NMOS transistor DV2. The PMOS transistor LD2 and NMOS transistor DV2 are connected in series between power supply potential VDD and source potential VSSC (source terminal ST).

More specifically, the source terminal of the PMOS transistor LD1 is set at power supply potential VDD. The drain terminal of the PMOS transistor LD1 is connected to the drain terminal of the NMOS transistor DV1 via a memory node N1. The gate terminal of the PMOS transistor LD1 is connected to the gate terminal of the NMOS transistor DV1. The back-gate terminal (substrate gate terminal) of the PMOS transistor LD1 is set at power supply potential VDD. The source terminal of the NMOS transistor DV1 is set at source potential VSSC. The back-gate terminal of the NMOS transistor DV1 is set at ground potential VSS.

The source terminal of a PMOS transistor LD2 is set at power supply potential VDD. The drain terminal of the PMOS transistor LD2 is connected to the drain terminal of an NMOS transistor DV2 via a memory node N2. The gate terminal of the PMOS transistor LD2 is connected to the gate terminal of the NMOS transistor DV2. The back-gate terminal of the PMOS transistor LD2 is set at power supply potential VDD. The source terminal of the NMOS transistor DV2 is set at source potential VSSC. The back-gate terminal of the NMOS transistor DV2 is set at ground potential VSS.

The gate terminal of the PMOS transistor LD1 is connected to the memory node N2. The gate terminal of the PMOS transistor LD2 is connected to the memory node N1. In other words, the output of the first inverter circuit is connected to the input of the second inverter circuit, and the output of the second inverter circuit is connected to the input of the first inverter circuit.

The memory node N1 is connected to the corresponding bit line BL via an NMOS transistor XF1 as a transfer gate. The gate terminal of the NMOS transistor XF1 is connected to the corresponding word line WL. The back-gate terminal of the NMOS transistor XF1 is set at ground potential VSS.

The memory node N2 is connected to the corresponding bit line /BL via an NMOS transistor XF2 as a transfer gate. The gate terminal of the NMOS transistor XF2 is connected to the corresponding word line WL. The back-gate terminal of the NMOS transistor XF2 is set at ground potential VSS.

Figure 4:
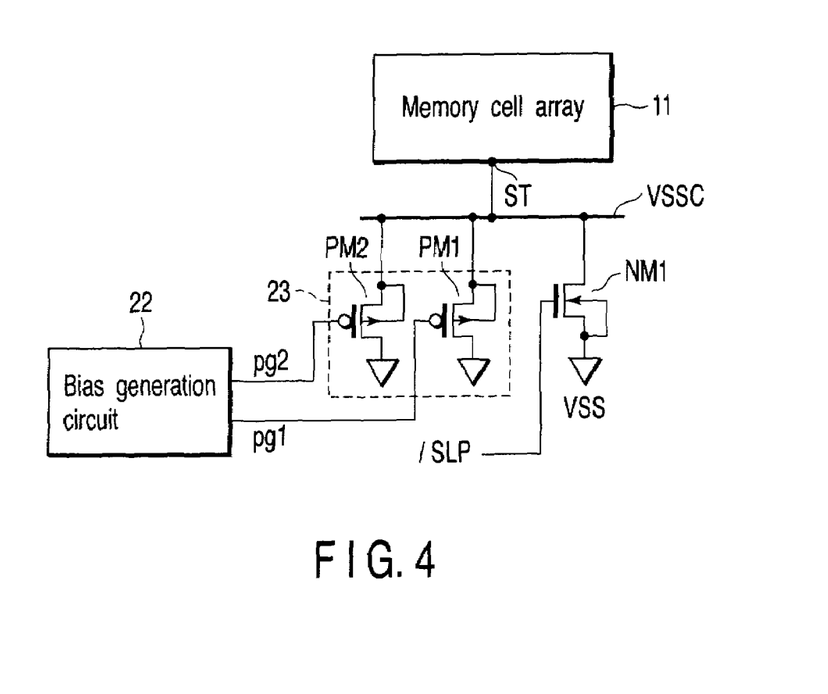
FIG. 4 is a circuit diagram mainly illustrating a circuit for performing level control of source potential VCCS.

The SRAM 10 controls the level of source potential VSSC. Namely, in the standby state (specifically, in the sleep mode), the source potential VSSC of the memory cell array 11 is increased to a value higher than ground potential VSS, thereby making a cell bias (a voltage applied to the memory cell MC) low. As a result, in the standby state, the leakage current of the memory cell array 11 can be reduced. A description will be given of a circuit structure for performing the operation of controlling the level of source potential VSSC. FIG. 4 mainly shows this circuit.

The SRAM 10 includes a clamp circuit 23 (in the embodiment, this circuit is formed of two clamping PMOS transistors PM1 and PM2), an NMOS transistor group 21 as a switching element group, and a bias generation circuit 22. For simplification, FIG. 4 shows only one NMOS transistor NM1 included in the NMOS transistor group 21.

The drain terminal of the NMOS transistor NM1 is set at source potential VSSC. The source and back-gate terminals of the NMOS transistor NM1 are set at ground potential VSS. The gate terminal of the NMOS transistor NM1 is supplied with, for example, a sleep signal /SLP sent from the control circuit 17.

The sleep signal /SLP is at the high level in the normal operation mode, and at the low level in the sleep mode. Accordingly, the NMOS transistor N1 is turned on in the normal operation mode, and is turned off in the sleep mode. The normal operation mode indicates the states, in which the SRAM 10 is accessed, including states in which writing and reading of data to and from each memory cell MC are performed.

The sleep mode indicates a low-power-consumption state. Namely, the sleep mode indicates a special standby state in which leakage currents flowing through the internal circuits are reduced by, for example, lowering the internal voltages applied to the internal circuits, or temporarily interrupting the application of an internal voltage. The standby state indicates a state in which the SRAM 10 is not accessed with data stored therein (i.e., no reading or writing data is performed).

The source and back-gate terminals of the PMOS transistor PM1 are connected to a VSSC line. The drain terminal of the PMOS transistor PM1 is set at ground potential VSS. Bias potential pg1 generated by the bias generation circuit 22 is applied to the gate terminal of the PMOS transistor PM1.

The source and back-gate terminals of the PMOS transistor PM2 are connected to the VSSC line. The drain terminal of the PMOS transistor PM2 is set at ground potential VSS. Bias potential pg2 generated by the bias generation circuit 22 is applied to the gate terminal of the PMOS transistor PM2.

Figure 5:
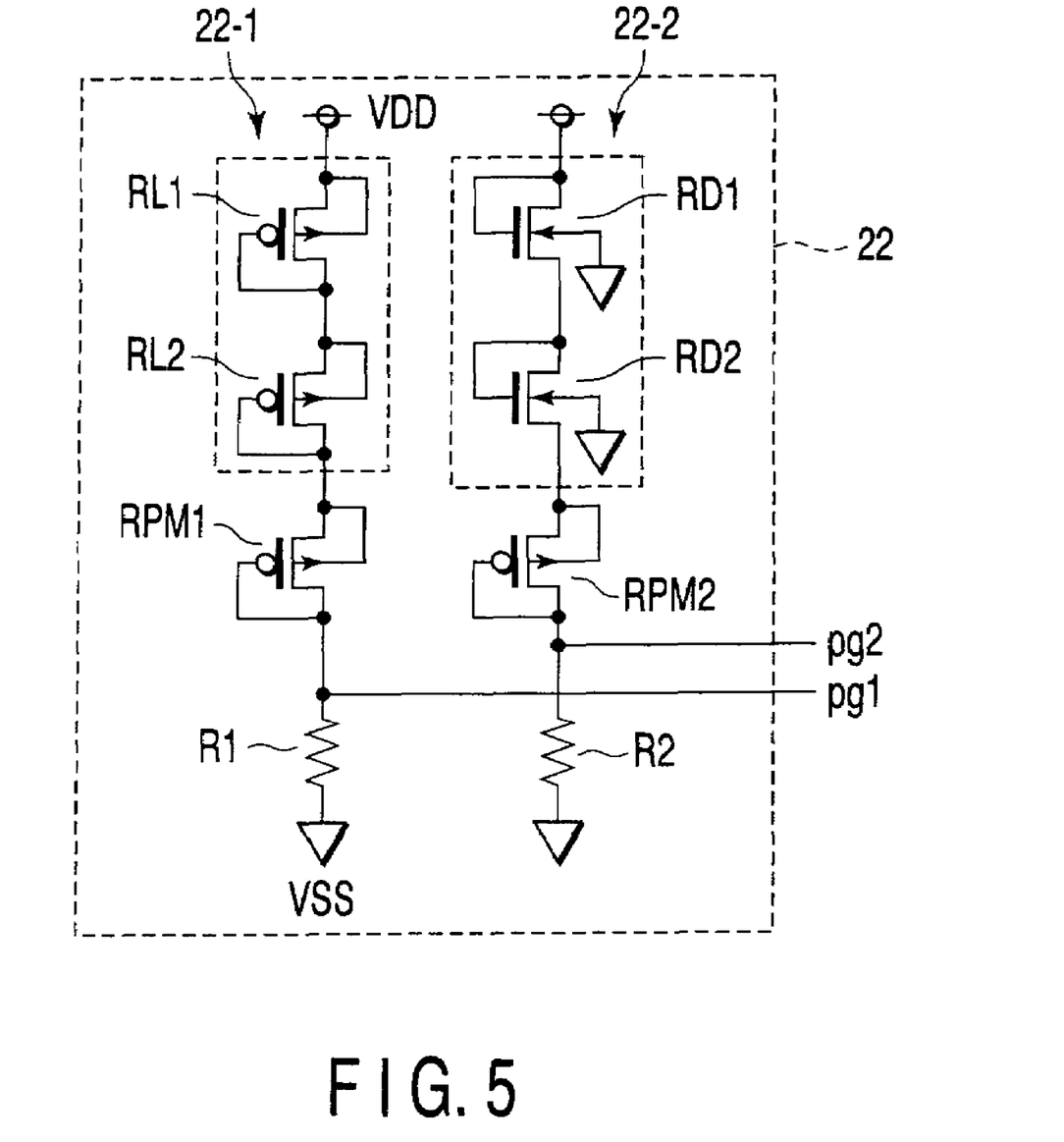
FIG. 5 is a circuit diagram illustrating an example of a bias generation circuit 22 according to the first embodiment.

FIG. 5 shows an example of the bias generation circuit 22. The bias generation circuit 22 is constructed so that bias potentials pg1 and pg2 each reflect a change in the potential difference between power supply potential VDD and ground potential VSS, and a change in the threshold voltage Th of the transistors (this is an error mainly caused during the manufacturing process of the transistors).

As shown in FIG. 5, a bias generation circuit 22-1 for generating the bias potential pg1 includes a PMOS transistor RL1, PMOS transistor RL2, PMOS transistor RPM1 and resistor R1, which are connected in series in this order between power supply potential VDD and ground potential VSS.

More specifically, the gate terminal and drain terminal of the PMOS transistor RL1 are connected to each other (which realizes a diode connection). Similarly, the gate terminal and drain terminal of the PMOS transistor RL2 are connected to each other. The back-gate terminal and source terminal of the PMOS transistor RL1 are connected to each other. Similarly, the back-gate terminal and source terminal of the PMOS transistor RL2 are connected to each other. The source terminal of the PMOS transistor RL1 is set at power supply potential VDD. The drain terminal of the PMOS transistor RL1 is connected to the source terminal of the PMOS transistor RL2. The drain terminal of the PMOS transistor RL2 is connected to the source terminal of the PMOS transistor RPM1.

The gate terminal and drain terminal of the PMOS transistor RPM1 are connected to each other (which realizes a diode connection). The back-gate terminal and source terminal of the PMOS transistor RPM1 are connected to each other. The drain terminal of the PMOS transistor RPM1 is connected to the resistor R1.

The PMOS transistors RL1 and RL2 are replicas of the load PMOS transistor (e.g., LD1) included in the memory cell MC. Namely, the PMOS transistors RL1 and RL2 are designed (formed in the same process) to have the same specifications (size, layout pattern, etc.) as the PMOS transistor LD1 and have the same threshold voltage as the PMOS transistor LD1. By virtue of the two replica transistors, the circuit can have a margin for an error in threshold voltage.

Further, the PMOS transistor RPM1 is a replica of the PMOS transistor PM1. The bias potential pg1 is output from the connection node (i.e., the drain terminal of the PMOS transistor RPM1) of the PMOS transistor RPM1 and resistor R1.

Similarly, a bias generation circuit 22-2 for generating the bias potential pg2 includes a PMOS transistor RD1, NMOS transistor RD2, PMOS transistor RPM2 and resistor R2 connected in series between power supply potential VDD and ground potential VSS.

More specifically, the gate terminal and drain terminal of the NMOS transistor RD1 are connected to each other (which realizes a diode connection). Similarly, the gate terminal and drain terminal of the NMOS transistor RD2 are connected to each other. The back-gate terminals of the NMOS transistors RD1 and RD2 are set at ground potential VSS. The drain terminal of the NMOS transistor RD1 is set at power supply potential VDD. The source terminal of the NMOS transistor RD1 is connected to the drain terminal of the NMOS transistor RD2. The source terminal of the NMOS transistor RD2 is connected to the source terminal of the PMOS transistor RPM2.

The gate terminal and drain terminal of the PMOS transistor RPM2 are connected to each other. The back-gate terminal and source terminal of the PMOS transistor RPM2 are connected to each other. The drain terminal of the PMOS transistor RPM2 is connected to the resistor R2.

The NMOS transistors RD1 and RD2 are replicas of the driving NMOS transistor (e.g., DV1) included in the memory cell MC. The PMOS transistor RPM2 is a replica of the PMOS transistor PM2.

The operation of controlling source potential VSSC will now be described. During the normal operation (/SLP=H), the NMOS transistor NM1 is turned on, therefore source potential VSSC is 0V (=ground potential VSS).

In contrast, in the sleep mode (/SLP=L), the NMOS transistor NM1 is turned off. At this time, source potential VSSC is gradually increased from 0V by the leakage current of the memory cells MC.

Further, bias potential pg1 is applied to the gate terminal of the PMOS transistor PM1. When source potential VSSC is increased from 0V to a level higher than bias potential pg1 by the threshold voltage Vth of the PMOS transistor PM1, the PMOS transistor PM1 is turned on, thereby clamping source potential VSSC at the increased level.

Bias potential pg1 generated by the bias generation circuit 22-1 corresponds to the voltage lower than power supply potential VDD by the sum of the threshold voltages of the three replica transistors (RL1, RL2, RPM1). Namely, the bias generation circuit 22-1 monitors the replicas (RL1, RL2) corresponding to the load PMOS transistors included in the memory cell MC, thereby controlling bias potential pg1 to an optimal value corresponding to the threshold voltage Vth of the load PMOS transistors. As a result, the cell bias applied to the memory cell MC in the sleep mode can be reduced, therefore the leakage current can be effectively reduced with the stored data maintained.

The same can be said of the bias generation circuit 22-2. Accordingly, when one of the PMOS transistors PM1 and PM2 is turned on, source potential VSSC is clamped (fixed), with the result that the leakage current can be effectively reduced without destructing the data stored in the memory cell MC.

The switching elements 21 (the NMOS transistors NM1 in the embodiment) for setting the source potential VSSC of the memory cell MC to VSS in the normal operation mode are dispersed along ends of each memory cell array 11 in the cell array area, as is indicated by the hatched portions of FIG. 1.

On the other hand, the clamping PMOS transistors PM1 and PM2 are not arranged along the ends of each memory cell array 11, but arranged in the peripheral circuit area located outside the cell array area. The bias generation circuit 22 is also provided in the peripheral circuit area. The PMOS transistors PM1 and PM2 are provided near the bias generation circuit 22. FIG. 1 shows a case where a single bias generation circuit 22 is provided for four memory cell arrays 11.

More specifically, the clamp circuit 23 including the PMOS transistors PM1 and PM2 is arranged between four memory cell arrays 11 and a single bias generation circuit 22 as shown in FIG. 1. Alternatively, the PMOS transistors PM1 and PM2 may be incorporated in the bias generation circuit 22 and provided in the area of the bias generation circuit 22.

Figure 6:
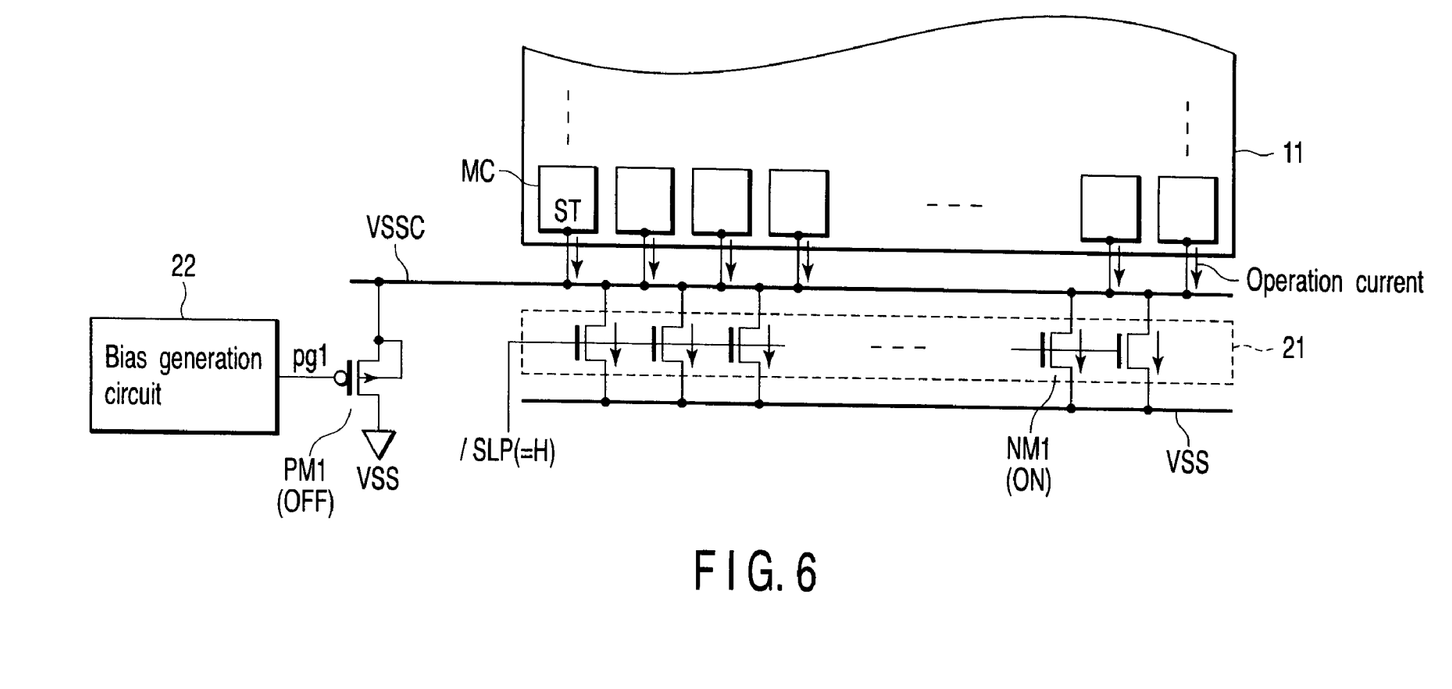
FIG. 6 is a diagram illustrating a current for operating each memory cell MC during normal operation.

As previously mentioned, the NMOS transistor NM1 is turned on during the normal operation. When it is turned on, it must cause the operation current of each memory cell MC to completely flow to the ground VSS. FIG. 6 is a diagram illustrating the operation current of each memory cell MC during the normal operation. FIG. 6 shows only the clamping PMOS transistor PM1. However, the following operation can also be said of the clamping PMOS transistor PM2.

As shown in FIG. 6, the NMOS transistors 21 are dispersed along ends of each memory cell array 11 in the cell array area. During the normal operation (/SLP=H), the clamping PMOS transistor PM1 is turned off, and the NMOS transistors 21 are turned on. Accordingly, the operation currents of the memory cells MC flow to the ground VSS via the VSSC line and NMOS transistors 21.

If the wiring length between the memory cells MC and the ground VSS is long, a great parasitic resistance occurs because of the long wiring length. If a great parasitic resistance occurs, the source voltage at each memory cell MC is increased from ground potential VSS by a voltage drop (IR drop) in the wiring due to the parasitic resistance, resulting in degradation of the performance due to a drop in cell current.

To avoid this, it is necessary to connect the VSSC line to ground potential VSS (VSS line) with as a low resistance as possible. To this end, it is necessary to increase the entire size of the NMOS transistors 21 in order to provide a sufficient current drivability. In the embodiment, a plurality of NMOS transistors NM1 are connected in parallel between the VSSC line and VSS line near the memory cell arrays 11.

Furthermore, if there are variations in the distance between each pair of adjacent ones of the NMOS transistors NM1, a high parasitic resistance occurs in the wiring portion of a greater length. As a result, a great voltage drop occurs in the portion, which means that variations occur in source potential VSSC between different portions. To avoid this, in the embodiment, the NMOS transistors NM1 are arranged at regular intervals as shown in FIG. 6.

Thus, the parasitic resistance of the wiring set at ground potential VSS is reduced to thereby suppress a voltage drop due to the parasitic resistance. The dispersion of the NMOS transistors NM1 along ends of each array enables the operation current of the memory cells MC to flow to the ground VSS, with substantially the same parasitic resistance between different portions of each array. In other words, the dependence of the ground resistance upon the position on each array can be eliminated.

Figure 7:
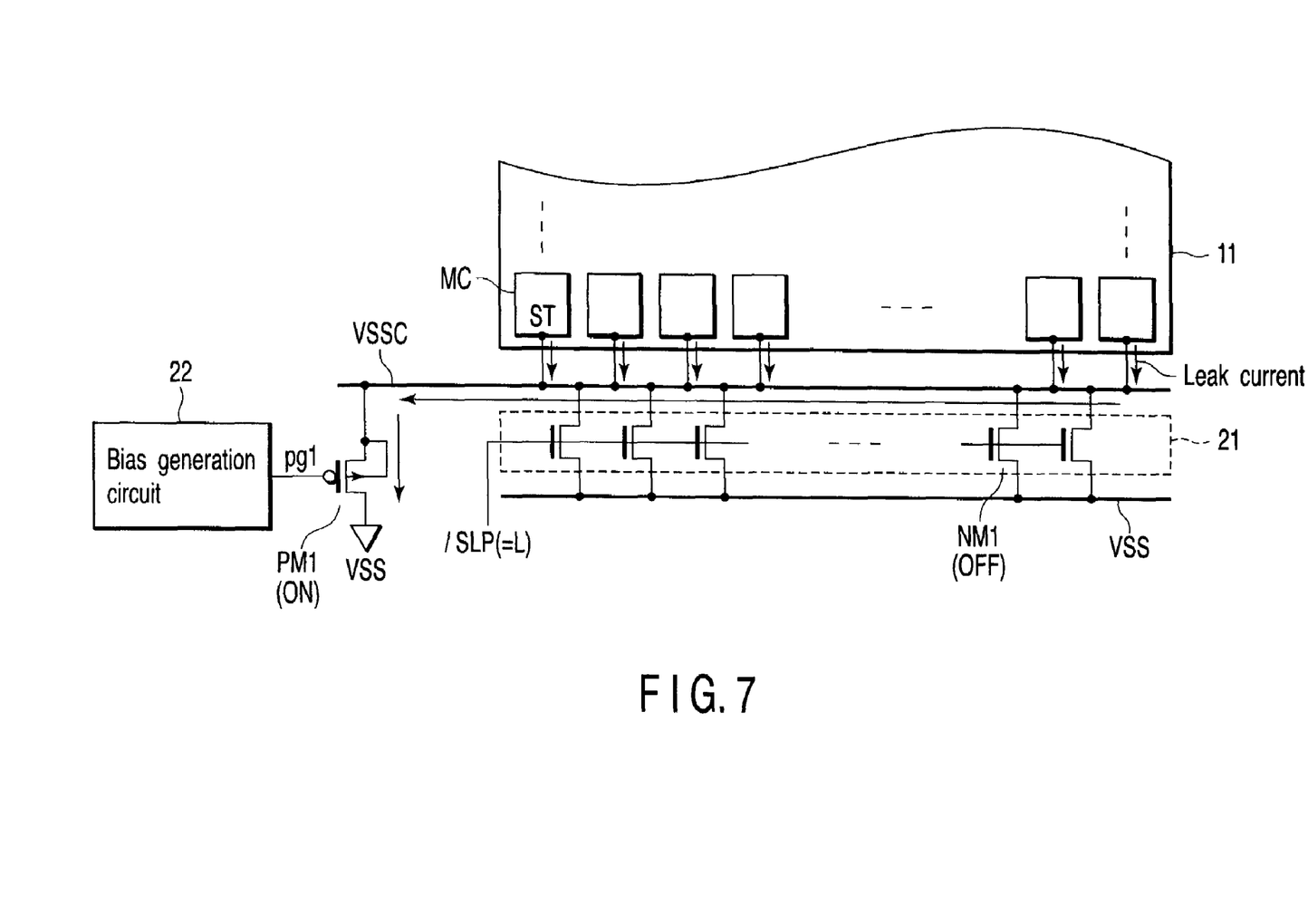
FIG. 7 is a diagram illustrating a leakage current occurring in each memory cell MC in a sleep mode.

On the other hand, it is sufficient if the currents to be flown through the PMOS transistors PM1 and PM2 in the sleep mode are balanced with the leakage currents of the memory cells MC, with the VSS level of the memory cells MC increased for leakage current reduction. FIG. 7 is a diagram illustrating the leakage current of each memory cell MC in the sleep mode.

As shown in FIG. 7, in the sleep mode (/SLP=L), the clamping PMOS transistor PM1 is turned on, and the NMOS transistors 21 are turned off. Accordingly, the leakage current of the memory cells MC flows to the ground VSS via the VSSC line and PMOS transistor PM1.

Since the leakage current of the memory cells MC is very small, the PMOS transistor PM1 may have a significantly smaller current drivability than the NMOS transistors 21 that must flow an operation current.

As described above, since the leakage current of the memory cells MC is very small (e.g., about several μA), the PMOS transistors PM1 and PM2 are arranged not along ends of each array, but in the peripheral circuit area. Even if the whole leakage current of the memory cells MC flows into the PMOS transistor PM1 or PM2 via the VSSC line, only a small change occurs in the potential at the VSSC line due to the resultant parasitic resistance. Namely, the VSSC potential difference between different portions of the array can be minimized.

For instance, assume that the length, width and sheet resistance of the VSSC line is 1000 μm, 2 μm and 100 mΩ/□, respectively, and the whole leakage current is 10 μA. In this case, even if it is assumed that all leakage current flows from the memory cell MC located remotest from the PMOS transistor PM1, the potential difference is an ignorable value of 0.5 mV (=100 mΩ×(1000/2)×10 μA). Even when the two PMOS transistors PM1 and PM2 flow the respective leakage currents, the whole current is twice the value at most, which does not matter.

Thus, no problem will occur in the normal operation mode or sleep mode, even if the NMOS transistors NM1 are dispersed in the cell array area along ends of the arrays, and the PMOS transistors PM1 and PM2 are located in the peripheral circuit area.

Further, the control signal supplied to the gate terminal of the PMOS transistor PM1 is an analog signal (of bias potential pg1). Similarly, the control signal supplied to the gate terminal of the PMOS transistor PM2 is an analog signal (of bias potential pg2).

The longer the bias potential wiring, the greater the parasitic resistance. Accordingly, coupling noise inevitably increases a change in the bias potential. This makes it difficult to accurately control the levels of the cell biases.

In the first embodiment, the PMOS transistors PM1 and PM2 are located not in the cell array area but near the bias generation circuit 22, therefore the wires for supplying bias potentials pg1 and pg2 are very short since they connect only the PMOS transistors PM1 and PM2 and the bias generation circuit 22. This is much more advantageous than in the prior art in which the corresponding transistors are located along ends of the arrays and hence long wires are required to connect them.

Thus, the first embodiment is free from the problem of an increase in the installment area of the wires pg1 and pg2, and the level of noise related to the wires pg1 and pg2 can be significantly reduced. Namely, there is no need for shielding the wires pg1 and pg2. Even if such a shield is provided, the problem of an increase in the installment area is avoided since the shield covers only a short distance.

In addition, since it is not necessary to provide the PMOS transistors PM1 and PM2 along end of the array, no N-well for the PMOS transistors PM1 and PM2 is necessary near the array. Therefore, it is sufficient if the NMOS transistors NM1 are provided in the P-well regions of the arrays. This means that no element isolation regions due to new well boundaries are necessary, thereby avoiding an increase in installment area due to such element isolation regions.

If the clamping PMOS transistors PM1 and PM2 are dispersed along ends of the arrays, a large number of PMOS transistors PM1 and PM2 can be provided, and hence variations in the characteristics of the transistors can be reduced. However, in the first embodiment, the clamping PMOS transistors are arranged in the peripheral circuit area near the bias generation circuit 22. Therefore, if a large number of clamping PMOS transistors are provided, this causes an increase in the peripheral circuit area.

It should be noted that no large current drivability is required in the clamping PMOS transistors, and that it is sufficient if the transistors flow leakage currents. The important thing is that the clamping transistor PM1 (or PM2) coincides in characteristic with the replica transistor RPM1 (or RPM2) of the bias generation circuit 22.

In light of the above, the gate length of the clamping transistors PM1 and PM2 is set longer than the gate length (of the minimum feature size) of a MOS transistor (e.g., the NMOS transistor NM1) generally used in a circuit which requires a current drivability. The minimum feature size is determined from, for example, the design rules applied for the transistors. The design rules are determined from the minimum processing size of the gate electrodes that is determined during manufacturing (specifically, determined by the accuracy of the exposure apparatus).

Setting the gate length of the clamping PMOS transistors longer than the minimum feature size can overcome variations in gate length due to variations in processing or Line Edge Roughness (LER). Accordingly, an increase in gate length enables variations in the characteristics of transistors to be suppressed without increasing the number of clamping MOS transistors (for example, even if only one clamping MOS transistor is employed, such variations can be suppressed).

The gage lengths of the transistors PM1 and PM2 are made substantially equal to those of the transistors RPM1 and RPM2, respectively, which enables accurate control of source potential VSSC.

Second Embodiment

Figure 8:
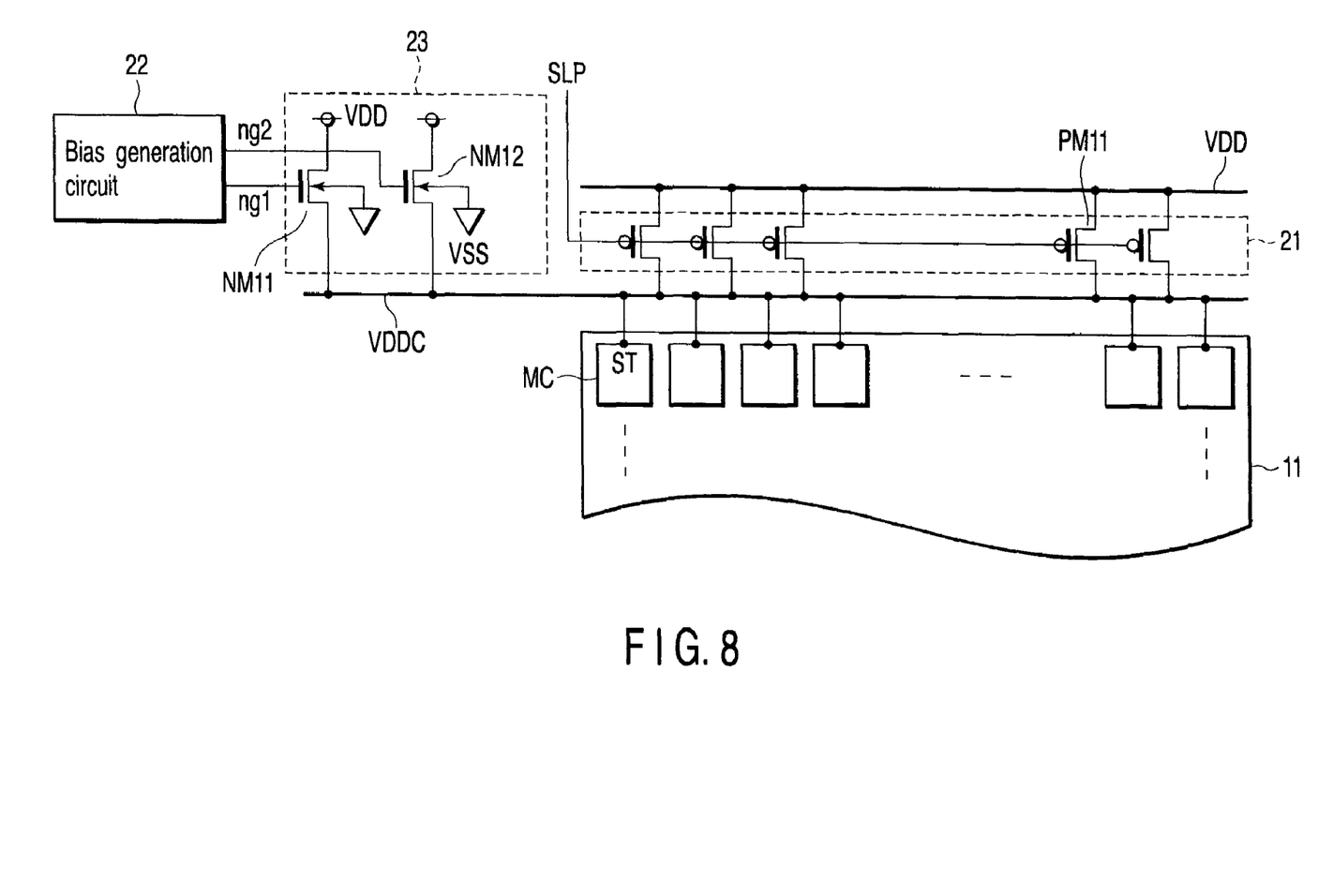
FIG. 8 is a diagram illustrating an essential part of an SRAM 10 according to a second embodiment.

In a second embodiment of the invention, the leakage current is reduced by controlling the source potential (VDDC) of each memory cell MC. The structure employed in the second embodiment, in which the clamp circuit 23 is located near the bias generation circuit 22, and the switching elements 21 are dispersed along ends of the memory cell arrays 11, is similar to the first embodiment.

FIG. 8 is a diagram illustrating an essential part of an SRAM 10 according to the second embodiment. As shown, the SRAM 10 comprises the clamp circuit 23, the PMOS transistor group 21 as a switching element group, and the bias generation circuit 22.

The PMOS transistor group 21 includes a plurality of PMOS transistors PM11 connected in series between a power supply (VDD) line and a source potential (VDDC) line. Specifically, the drain terminals of the PMOS transistors PM11 are connected to the source potential (VDDC) line. The source terminals and back-gate terminals of the PMOS transistors PM11 are connected to the power supply (VDD) line. A sleep signal SLP generated by the control circuit 17, for example, is input to the gate terminals of the PMOS transistors PM11.

The sleep signal SLP is at the low level in the normal operation mode, and at the high level in the sleep mode. Accordingly, the PMOS transistors PM11 are turned on in the normal operation mode, and are turned off in the sleep mode.

Figure 9:
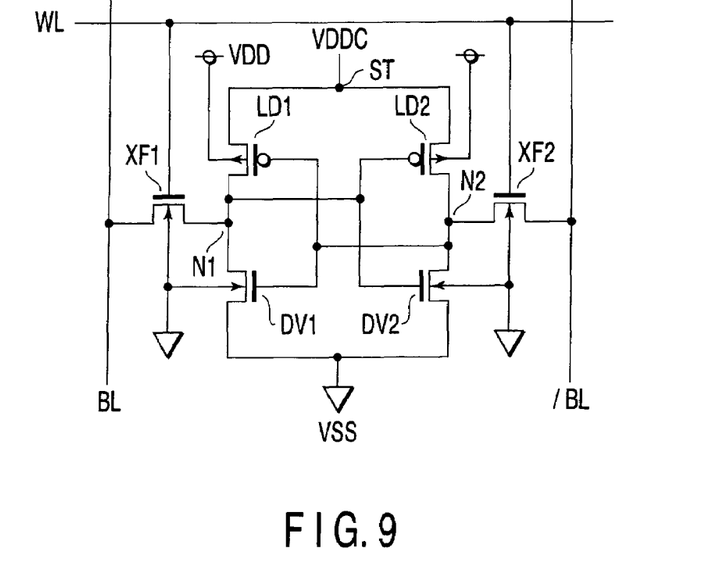
FIG. 9 is a circuit diagram illustrating a memory cell MC according to the second embodiment.

FIG. 9 is a circuit diagram illustrating a memory cell MC according to the second embodiment. As shown, the PMOS transistor LD1 and NMOS transistor DV1 are connected in series between source terminal ST (to which the source potential VDDC of the load PMOS transistor is applied) and ground potential VSS. The PMOS transistor LD2 and NMOS transistor DV2 are connected in series between source terminal ST and ground potential VSS.

More specifically, the source terminals of the PMOS transistors LD1 and LD2 are set at source potential VDDC via source terminal ST. The source terminals of the NMOS transistors DV1 and DV2 are set at ground potential VSS. The other structures are similar to those shown in FIG. 3.

The structure of the clamp circuit 23 will be described. As shown in FIG. 8, the clamp circuit 23 comprises two clamping NMOS transistors NM11 and NM12. The source terminal of the NMOS transistor NM11 is connected to the VDDC line. The back-gate terminal of the NMOS transistor NM11 is set at ground potential VSS. The drain terminal of the NMOS transistor NM11 is set at power supply potential VDD. Bias potential ng1 generated by the bias generation circuit 22 is applied to the gate terminal of the NMOS transistor NM11.

The source terminal of the NMOS transistor NM12 is connected to the VDDC line. The back-gate terminal of the NMOS transistor NM12 is set at ground potential VSS. The drain terminal of the NMOS transistor NM12 is set at power supply potential VDD. Bias potential ng2 generated by the bias generation circuit 22 is applied to the gate terminal of the NMOS transistor NM12.

Figure 10:
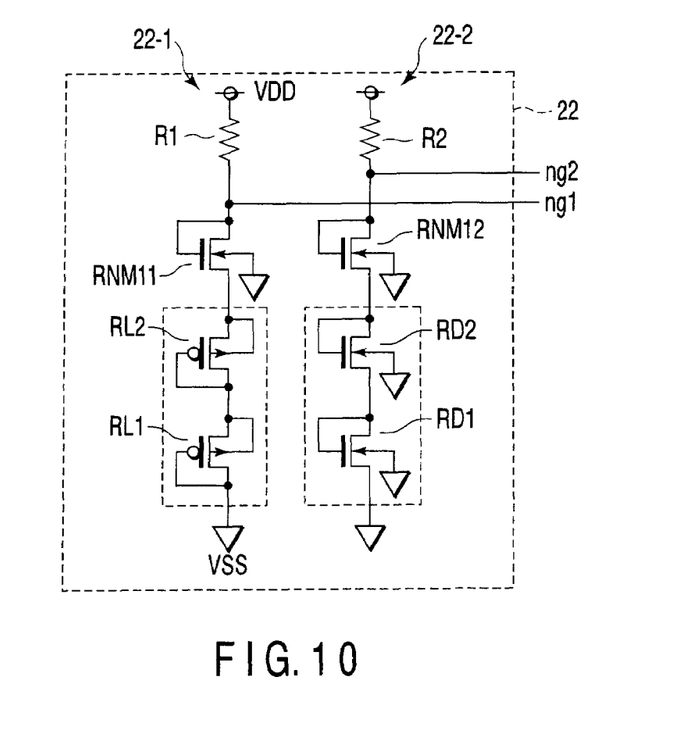
FIG. 10 is a circuit diagram illustrating an example of a bias generation circuit 22 according to the second embodiment.

FIG. 10 shows an example of the bias generation circuit 22. As shown, the bias generation circuit 22 is constructed so that bias potentials ng1 and ng2 each reflect a change in the potential difference between the power supply potential VDD and the ground potential VSS, and a change in the threshold voltage Vth of the transistors (mainly due to errors in processing).

The bias generation circuit 22-1 for generating bias potential ng1 includes a resistor R1, NMOS transistor RNM11, NMOS transistor RL2 and NMOS transistor RL1, which are connected in series in this order between power supply potential VDD and ground potential VSS.

More specifically, the gate terminal and drain terminal of the NMOS transistor RNM11 are connected to each other (which realizes a diode connection). The drain terminal of the NMOS transistor RNM11 is connected to the resistor R1. The back-gate terminal of the NMOS transistor RNM11 is set at ground potential VSS. The source terminal of the NMOS transistor RNM11 is connected to the drain terminal of the PMOS transistor RL2.

The gate terminal and drain terminal of the PMOS transistor RL2 are connected to each other (which realizes a diode connection). Similarly, the gate terminal and drain terminal of the PMOS transistor RL2 are connected to each other (which realizes a diode connection). The back-gate terminal and source terminal of the PMOS transistor RL1 are connected to each other. Similarly, the back-gate terminal and source terminal of the PMOS transistor RL2 are connected to each other. The source terminal of the PMOS transistor RL1 is set at power supply potential VDD.

The NMOS transistor RNM11 is a replica of the NMOS transistor NM11. Bias potential ng1 is output from the drain terminal of the NMOS transistor RNM11.

Similarly, the bias generation circuit 22-2 for generating bias potential ng2 includes a resistor R2, NMOS transistor RNM12, NMOS transistor RD2 and NMOS transistor RD1, which are connected in series in this order between power supply potential VDD and ground potential VSS. The NMOS transistor RNM12 is a replica of the NMOS transistor NM12.

A description will be given of level control of the source potential VDD. In the normal operation mode (SLP=L), the PMOS transistors 21 are turned on, therefore the source potential VDDC is equal to the power supply potential VDD.

In contrast, in the sleep mode (SLP=H), the PMOS transistors 21 are turned off, therefore the source potential VDDC gradually decreases from the power supply potential VDD because of a leakage current.

Further, bias potential ng1 is applied to the gate terminal of the NMOS transistor NM11. When the source potential VDDC decreases from the power supply potential VDD to a level lower than bias potential ng1 by the threshold voltage Vth of the NMOS transistor NM11, the clamping NMOS transistor NM 11 is turned on, thereby clamping (fixing) the source potential VCCD.

The bias generation circuit 22-1 generates bias potential ng1 corresponding to a voltage higher than ground potential VSS by the sum of the threshold voltages of the three replica transistors RL1, RL2 and RNM11. Namely, the bias generation circuit 22-1 monitors the replicas (RL1, RL2) of the load PMOS transistors of each memory cell MC, thereby controlling bias potential ng1 to an optimal bias corresponding to the threshold voltage Vth of the MOS transistors. As a result, in the sleep mode, a low cell bias is applied to each memory cell MC to effectively reduce the leakage current with the stored data maintained as it is.

The same can be said of the bias generation circuit 22-2. That is, when the clamping NMOS transistor NM11 or NM12 is turned on, the source potential VDDC is clamped (fixed), whereby the leakage current can be effectively reduced with the stored data maintained as it is.

As aforementioned, the PMOS transistors PM11 as power supply interruption switches are dispersed in the cell array area along ends of cell arrays, while the clamping NMOS transistors NM11 and NM12 are provided in the peripheral circuit area outside the cell array area. This structure of the second embodiment can provide the same advantage as the first embodiment by controlling the source potential VDDC Also in the second embodiment, the gate length of the clamping NMOS transistors NM11 and NM12 is set longer than the gate length (of the minimum feature size) of a MOS transistor (e.g., the PMOS transistor PM11) generally used in a circuit which requires a current drivability. Further, a pair of transistors NM11 and RNM11 have the same gate length, and a pair of transistors NM12 and RMN12 have the same gate length.

As described above, the gate length longer than the minimum feature size enables variations in the characteristics of transistors to be suppressed without increasing the number of clamping MOS transistors (for example, even if only one clamping MOS transistor is employed, such variations can be suppressed).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array provided in a cell array area and including a plurality of memory cells, each memory cell being of a static type and formed of MIS transistors;
   a source potential line which applies a source potential to the memory cells;
   a switching element group including a plurality of switching elements and provided in the cell array area adjacent to the memory cell array, the switching element group electrically connecting the source potential line to a power supply potential line, when the memory cells are in an operation mode, and electrically disconnecting the source potential line from a ground potential line, when the memory cells are in a sleep mode;
   a first N-type MIS transistor connected between the source potential line and the power supply potential line, and fixing the source potential when the memory cells are in the sleep mode; and
   a bias generation circuit provided in a peripheral circuit area outside the cell array area, and supplying a first bias potential to a gate terminal included in the first MIS transistor,
   the first MIS transistor being provided in the peripheral circuit area.

2. The semiconductor memory device according to claim 1, wherein in the sleep mode, the source potential is fixed to a potential acquired by adding a threshold voltage of the first MIS transistor to the first bias potential.

3. The semiconductor memory device according to claim 1, wherein the switching elements are formed of second P-type MIS transistors.

4. The semiconductor memory device according to claim 1, wherein the first bias potential generated by the bias generation circuit reflects a change in a threshold voltage of MIS transistors included in the memory cell.

5. The semiconductor memory device according to claim 4, wherein:
   the memory cell includes an N-type driving MIS transistor and a P-type load MIS transistor; and
   the bias generation circuit includes a first replica transistor having a threshold voltage equal to a threshold voltage of the driving MIS transistor or the load MIS transistor.

* * * * *